US008458553B2

(12) United States Patent
Zhong et al.

(10) Patent No.: US 8,458,553 B2
(45) Date of Patent: Jun. 4, 2013

(54) SYSTEMS AND METHODS FOR UTILIZING CIRCULANT PARITY IN A DATA PROCESSING SYSTEM

(75) Inventors: Hao Zhong, Milpitas, CA (US); Weijun Tan, Longmont, CO (US); Yang Han, Santa Clara, CA (US); Zongwang Li, San Jose, CA (US); Shaohua Yang, Santa Clara, CA (US); Yuan Xing Lee, San Jose, CA (US)

(73) Assignee: LSI Corporation, San Jose, CA (US)

( * ) Notice: Subject to any disclaimer, the term of this patent is extended or adjusted under 35 U.S.C. 154(b) by 980 days.

(21) Appl. No.: 12/510,885

(22) Filed: Jul. 28, 2009

(65) Prior Publication Data

US 2011/0029839 A1 Feb. 3, 2011

(51) Int. Cl.
*H03M 13/00* (2006.01)
(52) U.S. Cl.
USPC ........... 714/752; 714/699; 714/701; 714/702; 714/763; 714/800
(58) Field of Classification Search
None
See application file for complete search history.

(56) References Cited

U.S. PATENT DOCUMENTS

| 5,278,846 | A | 1/1994 | Okayama et al. |
|---|---|---|---|
| 5,325,402 | A | 6/1994 | Ushirokawa |
| 5,392,299 | A | 2/1995 | Rhines et al. |
| 5,513,192 | A | 4/1996 | Janku et al. |
| 5,612,964 | A | 3/1997 | Haraszti |
| 5,701,314 | A | 12/1997 | Armstrong et al. |
| 5,717,706 | A | 2/1998 | Ikeda |
| 5,844,945 | A | 12/1998 | Nam et al. |
| 5,898,710 | A | 4/1999 | Amrany |
| 5,923,713 | A | 7/1999 | Hatakeyama |
| 5,978,414 | A | 11/1999 | Nara |
| 5,983,383 | A | 11/1999 | Wolf |
| 6,005,897 | A | 12/1999 | McCallister et al. |
| 6,023,783 | A | 2/2000 | Divsalar et al. |
| 6,029,264 | A | 2/2000 | Kobayashi et al. |
| 6,041,432 | A | 3/2000 | Ikeda |

(Continued)

FOREIGN PATENT DOCUMENTS

| WO | WO 2006/016751 | 2/2006 |
|---|---|---|
| WO | WO 2006/091797 | 8/2007 |

OTHER PUBLICATIONS

Ming Jiang; Chunming Zhao; Zhihua Shi; Yu Chen; , "An improvement on the modified weighted bit flipping decoding algorithm for LDPC codes," Communications Letters, IEEE , vol. 9, No. 9, pp. 814-816, Sep. 2005, doi: 10.1109/LCOMM.2005.1506712.*

(Continued)

*Primary Examiner* — Albert Decady
*Assistant Examiner* — Justin R Knapp
(74) *Attorney, Agent, or Firm* — Hamilton DeSanctis & Cha

(57) ABSTRACT

Various embodiments of the present invention provide systems and methods for data processing. For example, a method for data processing is disclosed that includes receiving a codeword that has at least a first circulant with a plurality of data bits and a first circulant parity bit, a second circulant with a plurality of data bits and a second circulant parity bit, and one or more codeword parity bits. The methods further include decoding the codeword using the one or more codeword parity bits to access the first circulant and the second circulant, performing a first circulant parity check on the first circulant, and performing a second circulant parity check on the second circulant.

24 Claims, 4 Drawing Sheets

U.S. PATENT DOCUMENTS

| | | | |
|---|---|---|---|
| 6,097,764 | A | 8/2000 | McCallister et al. |
| 6,216,251 | B1 | 4/2001 | McGinn |
| 6,266,795 | B1 | 7/2001 | Wei |
| 6,317,472 | B1 | 11/2001 | Choi et al. |
| 6,351,832 | B1 | 2/2002 | Wei |
| 6,377,610 | B1 | 4/2002 | Hagenauer et al. |
| 6,438,717 | B1 | 8/2002 | Butler et al. |
| 6,473,878 | B1 | 10/2002 | Wei |
| 6,625,775 | B1 | 9/2003 | Kim |
| 6,671,404 | B1 | 12/2003 | Katawani et al. |
| 6,748,034 | B2 | 6/2004 | Hattori et al. |
| 6,757,122 | B1* | 6/2004 | Kuznetsov et al. ............ 360/53 |
| 6,757,862 | B1 | 6/2004 | Marianetti, II |
| 6,788,654 | B1 | 9/2004 | Hashimoto et al. |
| 6,810,502 | B2 | 10/2004 | Eidson et al. |
| 6,986,098 | B2 | 1/2006 | Poeppelman |
| 7,010,051 | B2 | 3/2006 | Murayama et al. |
| 7,047,474 | B2 | 5/2006 | Rhee et al. |
| 7,058,873 | B2 | 6/2006 | Song et al. |
| 7,093,179 | B2 | 8/2006 | Shea |
| 7,184,486 | B1 | 2/2007 | Wu et al. |
| 7,191,378 | B2 | 3/2007 | Eroz et al. |
| 7,203,887 | B2 | 4/2007 | Eroz et al. |
| 7,257,764 | B2 | 8/2007 | Suzuki et al. |
| 7,310,768 | B2 | 12/2007 | Eidson et al. |
| 8,028,216 | B1* | 9/2011 | Yeo et al. ................... 714/755 |
| 8,095,859 | B1* | 1/2012 | Peterson et al. ............ 714/801 |
| 8,156,400 | B1* | 4/2012 | Yeo et al. ................... 714/758 |
| 2002/0184590 | A1* | 12/2002 | Ramaswamy et al. ....... 714/752 |
| 2003/0147167 | A1* | 8/2003 | Asano et al. ................. 360/53 |
| 2004/0098659 | A1 | 5/2004 | Bjerke et al. |
| 2005/0149845 | A1* | 7/2005 | Shin et al. ................... 714/801 |
| 2005/0216819 | A1 | 9/2005 | Chugg et al. |
| 2005/0273688 | A1 | 12/2005 | Argon |
| 2006/0020872 | A1 | 1/2006 | Richardson et al. |
| 2006/0031737 | A1 | 2/2006 | Chugg et al. |
| 2006/0140311 | A1 | 6/2006 | Ashley et al. |
| 2006/0168493 | A1 | 7/2006 | Song et al. |
| 2006/0195772 | A1 | 8/2006 | Graef et al. |
| 2006/0248435 | A1 | 11/2006 | Haratsch |
| 2007/0011569 | A1 | 1/2007 | Vila Casado et al. |
| 2007/0047635 | A1 | 3/2007 | Stojanovic et al. |
| 2007/0286270 | A1 | 12/2007 | Huang et al. |
| 2008/0049825 | A1 | 2/2008 | Chen et al. |
| 2008/0168330 | A1 | 7/2008 | Graef et al. |
| 2008/0184590 | A1* | 8/2008 | Lozano .......................... 34/622 |
| 2008/0301517 | A1* | 12/2008 | Zhong ......................... 714/752 |
| 2008/0301527 | A1* | 12/2008 | Graef .......................... 714/764 |
| 2010/0115371 | A1* | 5/2010 | Shen et al. ................... 714/752 |

OTHER PUBLICATIONS

Kan, M.; Okada, S.; Maehara, T.; Oguchi, K.; Yokokawa, T.; Miyauchi, T.; , "Hardware implementation of soft-decision decoding for Reed-Solomon code," Turbo Codes and Related Topics, 2008 5th International Symposium on , vol., no., pp. 73-77, Sep. 1-5, 2008, doi: 10.1109/TURBOCODING.2008.4658675.*

Miladinovic, N.; Fossorier, M.P.C.; , "Improved bit-flipping decoding of low-density parity-check codes," Information Theory, IEEE Transactions on , vol. 51, No. 4, pp. 1594-1606, Apr. 2005, doi: 10.1109/TIT.2005.844095.*

Collins and Hizlan, "Determinate State Convolutional Codes" IEEE Transactions on Communications, Dec. 1993.

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v.43, pp. 1118-1123, Mar. 20.

Zhong, "VLSI Architecture of LDPC Based Signal Detection and Coding System for Magnetic Recording Channel", Thesis, RPI, Troy, NY, pp. 1-95, May 2006.

Zhong, "Block-LDPC: A Practical LDPC Coding System Design Approach", IEEE Trans. on Circuits, Regular Papers, vol. 5, No. 4, pp. 766-775, Apr. 2005.

Casado et al., Multiple-rate low-density parity-check codes with constant blocklength, IEEE Transations on Communications, Jan. 2009, vol. 57, pp. 75-83.

* cited by examiner

SYSTEMS AND METHODS FOR UTILIZING CIRCULANT PARITY IN A DATA PROCESSING SYSTEM

BACKGROUND OF THE INVENTION

The present inventions are related to systems and methods for data processing, and more specifically to systems and methods for detecting and/or decoding data sets.

Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. It often requires two or more data detection/decoding processes before efforts to recover the retrieved data succeeds. In some cases, convergence on a desired output is not even possible. Each data detection/decoding process consumes considerable power which reduces the operational effectiveness of the process.

Hence, there exists a need in the art for advanced systems and methods for data recovery in data processing systems.

BRIEF SUMMARY OF THE INVENTION

The present inventions are related to systems and methods for data processing, and more specifically to systems and methods for detecting and/or decoding data sets.

Various embodiments of the present invention provide methods for data processing. The methods include receiving a codeword that has at least a first circulant with a plurality of data bits and a first circulant parity bit, a second circulant with a plurality of data bits and a second circulant parity bit, and one or more codeword parity bits. The methods further include decoding the codeword using the one or more codeword parity bits to access the first circulant and the second circulant, performing a first circulant parity check on the first circulant, and performing a second circulant parity check on the second circulant. In some instances of the aforementioned embodiments, the decoding is low density parity check decoding. In particular cases, the codeword is derived from a magnetic storage medium. In other particular cases, the codeword is derived from a wireless transfer medium.

In various instances of the aforementioned embodiments, the methods further include receiving a data input; assembling data packets of a circulant size less parity bits; calculating parity for each of the data packets; and augmenting each of the data packets with the calculated parity to create circulants. A combination of the circulants is a completed data set that is encoded to yield the codeword. In some cases, the encoding is low density parity check encoding.

In one or more instances of the aforementioned embodiments, decoding the codeword results in a satisfaction of all codeword parity check equations relying on the codeword parity bits, and both the first circulant parity check and the second circulant parity check succeed. In such cases, the methods may further include: stripping the first circulant parity from the first circulant to yield a first user data set; stripping the second circulant parity from the second circulant to yield a second user data set; and providing at least the first user data set and the second user data set as a data output.

In various instances of the aforementioned embodiments, decoding the codeword results in the failure of one or more parity check equations, and failure of the first circulant parity check fails. In such cases, the methods may further include modifying soft data derived from the decoding to indicate that the first circulant is likely incorrect; and decoding the codeword using the one or more codeword parity bits and the modified soft data. In other instances of the aforementioned embodiments, decoding the codeword results in the failure of one or more parity check equations, along with failure of the first circulant parity check and success of the second circulant parity check. In such cases, the methods may further include identifying a unique bit within the first circulant that is used one of the one or more failed parity check equations; and flipping the unique bit.

In some instances of the aforementioned embodiments, decoding the codeword results in a satisfaction of all codeword parity check equations (e.g., it converges to a valid codeword, but not the correct codeword) relying on the codeword parity bits, however, the first circulant parity check fails. In such instances, the methods may further include modifying soft data derived from the decoding to indicate that the first circulant is likely incorrect; and decoding the codeword using the one or more codeword parity bits and the modified soft data to access the first circulant and the second circulant. In some such cases, the methods may further include performing another first circulant parity check on the first circulant; and performing another second circulant parity check on the second circulant.

Other embodiments of the present invention provide data decoder circuits. Such data decoder circuits include a low density parity check decoder circuit and a circulant parity check circuit. The low density parity check decoder circuit decodes a codeword including at least a first circulant, a second circulant, and one or more codeword parity bits. The first circulant includes a plurality of data bits and a first circulant parity bit, and the second circulant includes a plurality of data bits and a second circulant parity bit. The circulant parity check circuit is operable to determine whether the parity of the first circulant is correct, and to determine whether the parity of the second circulant is correct. In some instances, the circuit is operable to provide a data output when at least the low density parity check decoder converges and both the parity of the first circulant and the parity of the second circulant are correct.

Yet other embodiments of the present invention provide hard disk drive systems. Such hard disk drive systems include a read channel circuit, a storage medium, and read/write head assembly. The read channel circuit includes a low density parity check decoder and a circulant parity check circuit. The low density parity check decoder decodes a codeword including at least a first circulant, a second circulant, and one or more codeword parity bits. The first circulant includes a plurality of data bits and a first circulant parity bit, and the second circulant includes a plurality of data bits and a second circulant parity bit. The circulant parity check circuit is operable to determine whether the parity of the first circulant is correct, and to determine whether the parity of the second circulant is correct. The read/write head assembly is disposed in relation to the storage medium and operable to access a representation of the codeword from the storage medium.

In some instances of the aforementioned embodiments, the read/write head assembly is further operable to write the representation of the codeword to the storage medium, and the read channel circuit further includes a circulant parity augmentation circuit that is operable to: receive an input data signal; break the input data signal into data sets; and to calculate parity for each of the data sets to yield parity enhanced data sets. A combination of the parity enhanced data sets yields a completed data set. The systems further include an encoding circuit that is operable to perform low density parity check encoding on the completed data set to yield the codeword. In some cases, breaking the input data signal into data sets includes breaking the input data signal into data sets of a size (circulant size−number of parity bits). In one particular case, the "number of parity bits" is one.

In various instances of the aforementioned embodiments, the low density parity check decoder is operable to indicate a problem condition when the application of low density parity check decoding converged and either of the first parity check or the second parity check failed. In other instances, the low density parity check decoder is operable to: provide a data output whenever the application of low density parity check decoding converged and both the first parity check and the second parity check succeed. In such cases, providing the data output includes stripping the first circulant parity from the first circulant to yield a first user data set, and stripping the second circulant parity from the second circulant to yield a second user data set. The data output includes the first user data set and the second user data set.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more specifically to systems and methods for detecting and/or decoding data sets.

Figure 1:
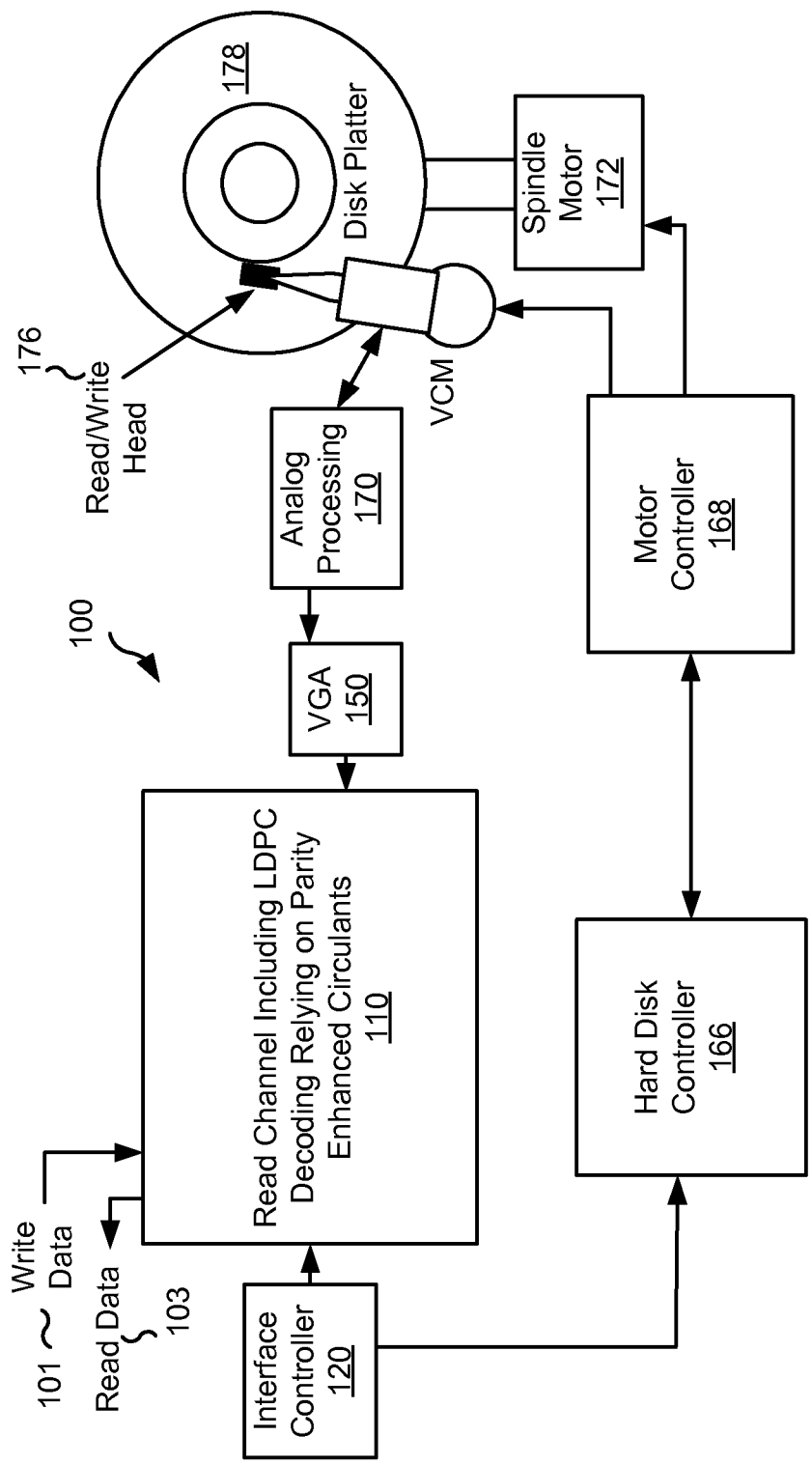
FIG. 1 shows a storage system including a read channel module relying on parity enhanced circulants in accordance with one or more embodiments of the present invention.

Turning to FIG. 1, a storage system 100 including read channel circuit 110 relying on parity enhanced circulants is shown in accordance various embodiments of the present invention. Storage system 100 may be, for example, a hard disk drive system. One example of a low density parity check code including parity enhanced circulants is shown below in relation to FIG. 3. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with a perpendicular recording scheme. For example, the magnetic signals may be recorded as either longitudinal or perpendicular recorded signals.

In a typical read operation, read/write head assembly 176 is accurately positioned by motor controller 168 over a desired data track on disk platter 178. The appropriate data track is defined by an address received via interface controller 120. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. The read data is provided as read data 103. A write operation is substantially the opposite of the preceding read operation with write data 101 being provided to read channel circuit 110. This data is then encoded and written to disk platter 178.

As used herein, a "codeword" is a set of data that has been encoded in preparation for transfer to, for example, a data receiver or a storage medium. A codeword typically includes a large number of user data bits augmented by one or more error checking bits (e.g., parity bits), with the user data bits and error checking bits being incorporated together. In some cases, the codeword is designed for use in relation to a low density parity check encoding/decoding system. In such cases, the codeword may be generated by multiplying the user data bits augmented with the error checking bits by a G-matrix as is known in the art. The G-matrix may be of a size N×M, resulting in a codeword of the same dimensions. In the decoding process, the resulting codeword is multiplied by an H-matrix which is the inverse of the G-matrix and results in recovery of the user data bits augmented by the one or more error checking bits. As used herein, the term "circulant" is used in its broadest sense to mean any subset of data used to form a codeword. For example, circulants may be matrices of dimensions A×B, with a number of circulants combined to form the overall N×M matrix. In one particular case, a codeword includes data from an entire sector of a hard disk drive storage medium. As a particular example, the codeword may be four thousand, ninety-six bits total formed of sixty-four 8×8 circulants. Based upon the disclosure provided herein, one of ordinary skill in the art will recognize a variety of codeword dimensions and/or circulant dimensions that may be used in relation to different embodiments of the present invention.

Figure 2:
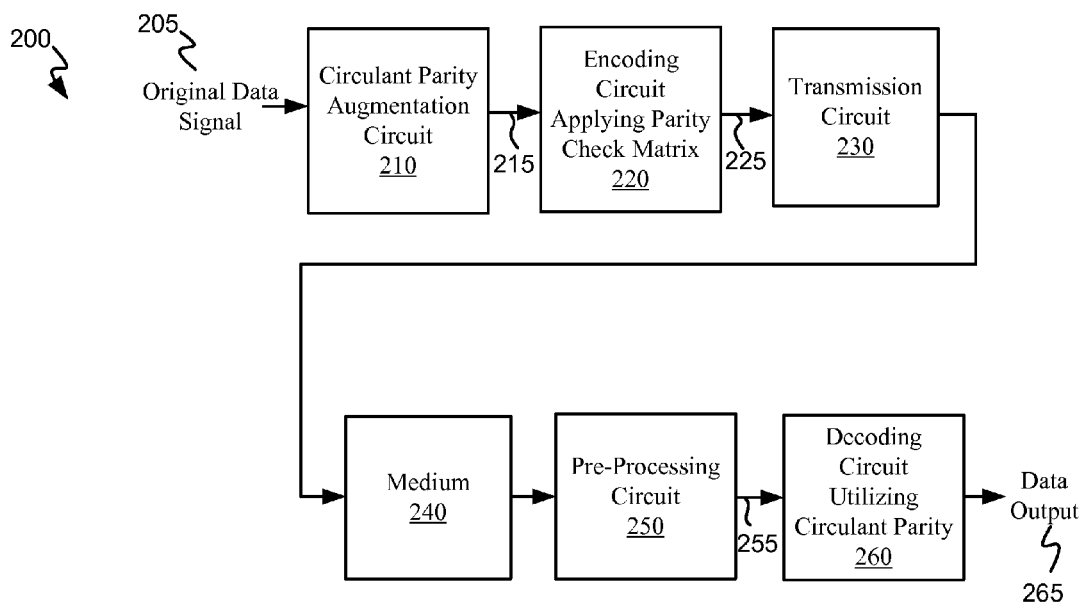
FIG. 2 is a block diagram of a data processing system in accordance with various embodiments of the present invention.

Turning to FIG. 2, a block diagram of a data processing system 200 is shown in accordance with various embodiments of the present invention. Data processing system 200 includes a circulant parity augmentation circuit 210 that receives an original data signal 205. Original data signal 205 may be, but is not limited to, a set of digital data that may be received either in parallel or in serial from a data source (not shown). Based upon the disclosure provided herein, one of ordinary skill in the art will recognize a variety of data sources from which original data signal 205 may be received and/or a variety of formats for original data signal 205. Circulant parity augmentation circuit 210 assembles original data signal 205 into circulant data sets of size (Circulant Size—1). As used herein, the phrase "circulant size" refers to a value corresponding to the total number of bits included in a given circulant. Thus, for example, an 8×8 circulant has a circulant size of eight. The circulant data sets are each augmented with a parity bit making the overall size of the circulant data set including parity equal to the circulant size. The added parity is calculated based upon the portion of original data signal 205 included in the circulant, and may be either odd or even parity depending upon the particular design. The resulting parity enhanced data is referred to as a parity enhanced circulant data set. A number of parity enhanced circulant data sets are created and appended one to the other to create a completed data set. Once a defined number of these parity enhanced circulant data sets have been created, additional error correction bits (i.e., codeword parity bits) are calculated and appended to the end to create a completed data set. In some cases where a low density parity check codeword is to be created, the added error correction bits are generated in accordance with the production of a low density parity check codeword as is known in the art. An example of a completed data set is graphically shown in FIG. 3 and is discussed in relation to FIG. 3.

A completed data set 215 is provided from circulant parity augmentation circuit 210 to an encoding circuit 220. Encoding circuit 220 applies a pre-defined parity matrix to generate a codeword 225 from completed data set 215. In some cases, where LDPC encoding is applied, encoding circuit 220 multiplies completed data set 215 by a pre-defined G-matrix as is known in the art to yield codeword 225. Codeword 225 is provided to a transmission circuit 230 that is responsible for transferring the codeword via a medium 240. In the case of a hard disk drive application, medium 240 may be a magnetic storage medium, and transmission circuit 230 may include a read/write head assembly disposed in relation to the magnetic storage medium. In the case of a data transmission system, medium 240 may be a wireless transmission medium, and transmission circuit 230 may be a radio frequency transmitter. Based upon the disclosure provided herein, one of ordinary skill in the art will recognize a variety of transmission circuits that may be used in relation to different embodiments of the present invention. Further, based upon the disclosure provided herein, one of ordinary skill in the art will recognize a variety of applications beyond wireless transmission and hard disk drives to which different embodiments of the present invention may be applied.

The data received from medium 240 is provided to a pre-processing circuit 250. In the example of a hard disk drive, the data received from medium 240 is received by accessing the magnetic storage medium. In the example of a wireless transmission system, the data received from medium 240 is received as RF signals. Pre-processing circuit 250 includes circuitry designed to process the received signal into a series of digital data samples 255. Digital data samples 255 represent the transferred codeword, and are provided to a decoding circuit 260.

Decoding circuit 260 performs a decoding algorithm on the transferred codeword to regenerate original data signal 205. The decoding algorithm in part utilizes the aforementioned circulant parity. In one example, where the codeword was encoded using a low density parity check algorithm, the transferred codeword is multiplied by an H-matrix which is the inverse of the G-matrix used in the encoding process. This multiplication yields the completed data set including the number of parity enhanced circulant data sets appended one to the other, and the additional error correction bits appended to the end. In some cases, errors are introduced to the completed data set during the transmission process. As such, there is a difference between the completed data set originally prepared by circulant parity augmentation circuit 210, and the completed data set included in digital data samples 255.

Low density parity check decoding is performed using the additional error correction bits as is known in the art. Low density parity check decoding is capable of correcting various of the introduced errors using the additional error correction bits, but often fails to converge on the originally provided completed data set. This lack of convergence occurs where the low density parity check bits added to the end of the completed data set in combination with the user bits and the added circulant parity bits fail to satisfy the various parity check equations of the H-matrix. When this failure of convergence occurs, it is known that one or more bits in the low density parity check user data of the completed data set are incorrect, but it does not identify which of the bits is incorrect. Where this is the case, the parity bit added to each of the parity enhanced circulants included in the completed data set may be used to determine the circulants that are causing the problem. By doing this, one or more circulants may be identified as correct where the circulant specific parity check succeeds, and other of the circulants may be identified as incorrect where the circulant specific parity check fails. In some cases, this information may be used in relation to any soft data created by the low density parity check decoding to correct the circulant that is in error. In this case, the completed data set that previously failed to converge may be considered to have converged. As a particular example, a 4×36×72 codeword may be able to correct an additional thirty-two bits on top of the standard low density parity check decoding that is performed. Once all of the errors are corrected, the decoding process is considered to have converged, and decoding circuit 260 provides a data output 265.

Alternatively, where a correction is not possible due to too many remaining errors, the soft data created by the low density parity check decoding may be modified based upon the success or failure of the parity checks of the individual circulants. Thus, for example, where the parity check of a particular circulant fails, the soft data associated with that circulant is reduced to indicate lower likelihood that the circulant was correctly decoded. This modified soft data may be used in a subsequent low density parity check decoding process. The modified soft data increases the probability that the completed data set will converge on the subsequent decoding iteration. Once the decoding process converges, decoding circuit 260 provides a data output 265.

It should be noted that the parity bits associated with each of the circulants can be used to verify if the convergence was upon the correct completed data set. Thus, for example, where the low density parity check decoding converged, but the parity check equations for one or more of the circulants failed, it can be concluded that the low density parity check decoding converged on the wrong completed data set. In such a case, the parity included in each of the circulants may be used to identify the error and in some cases to correct the error. Where the error cannot be corrected, the soft output may be modified as before followed by another iteration of low density parity check decoding similar to that discussed above. This avoids the potential for providing incorrect completed data sets as data output 265.

As just some advantages of the present invention, error correction capability is enhanced by using the error correction bit associated with each circulant. The enhanced error correction capability may be due to a reduction in the probability of mis-correcting bits within the completed data set. Further, where the last iteration of a low density parity check decoding process fails to converge and only a small number of errors remain, the parity bits within each of the circulants may be used to correct the remaining errors. This reduces the need for additional low density parity check decoding iterations which results in considerable power savings. Further, where a queue based decoding process such as that discussed in U.S. patent application Ser. No. 12/114,462 entitled "Systems and Methods for Queue Based Data Detection and Decoding" and filed by Yang et al. and/or U.S. patent application Ser. No. 12/430,927 entitled "Systems and Methods for Hard Decision Assisted Decoding" and filed by Zhong et al. is/are used, a reduced amount of queue buffering may be needed as minimal remaining errors may be corrected without requiring additional iterations. This may result in considerable savings in terms of both area and power. Both of the aforementioned applications are incorporated herein for all purposes. Based upon the disclosure provided herein, one of ordinary skill in the art will recognize a variety of other advantages that may be had in relation to different embodiments of the present invention.

Figure 3:
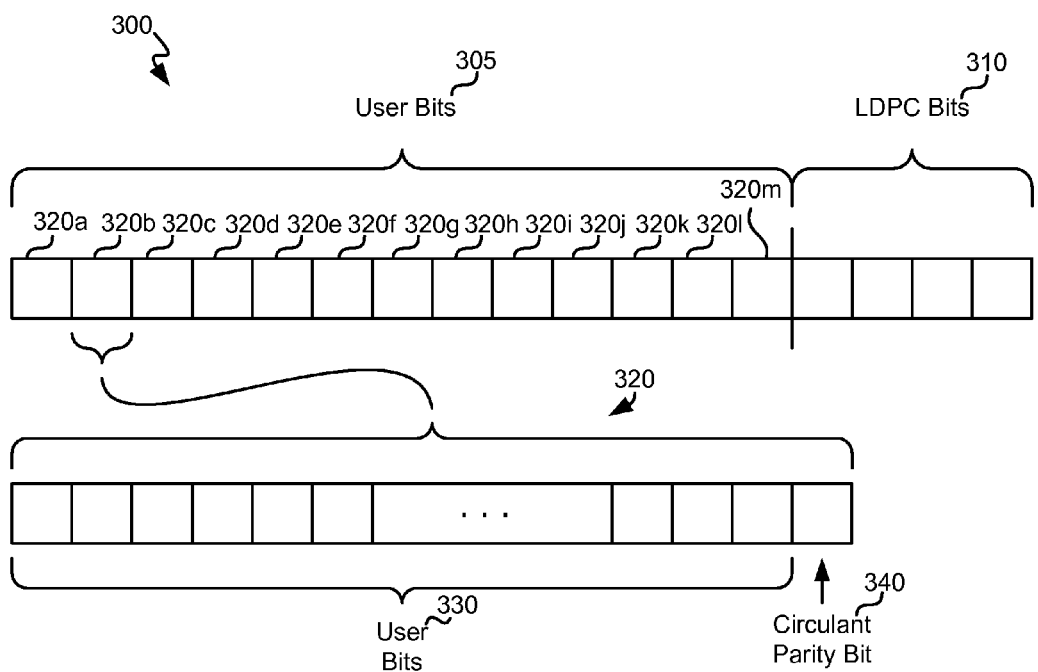
FIG. 3 shows an exemplary completed data set including parity enhanced circulants that may be used in relation to different embodiments of the present invention.

Turning to FIG. 3, an exemplary completed data set 300 is shown that includes a number of user bits 305 and a number of low density parity check bits 310. User bits 305 are grouped into circulants 320 (i.e., circulants 320*a*-320*m*). It should be noted that the approach disclosed herein may include any number of circulants and/or LDPC bits 310 depending upon the particular codeword design employed. Each of circulants 320 includes a number of user bits 330 with an appended circulant parity bit 340. Circulant parity bit 340 when included with user bits 330 yields a desired even or odd parity condition.

Figure 4:
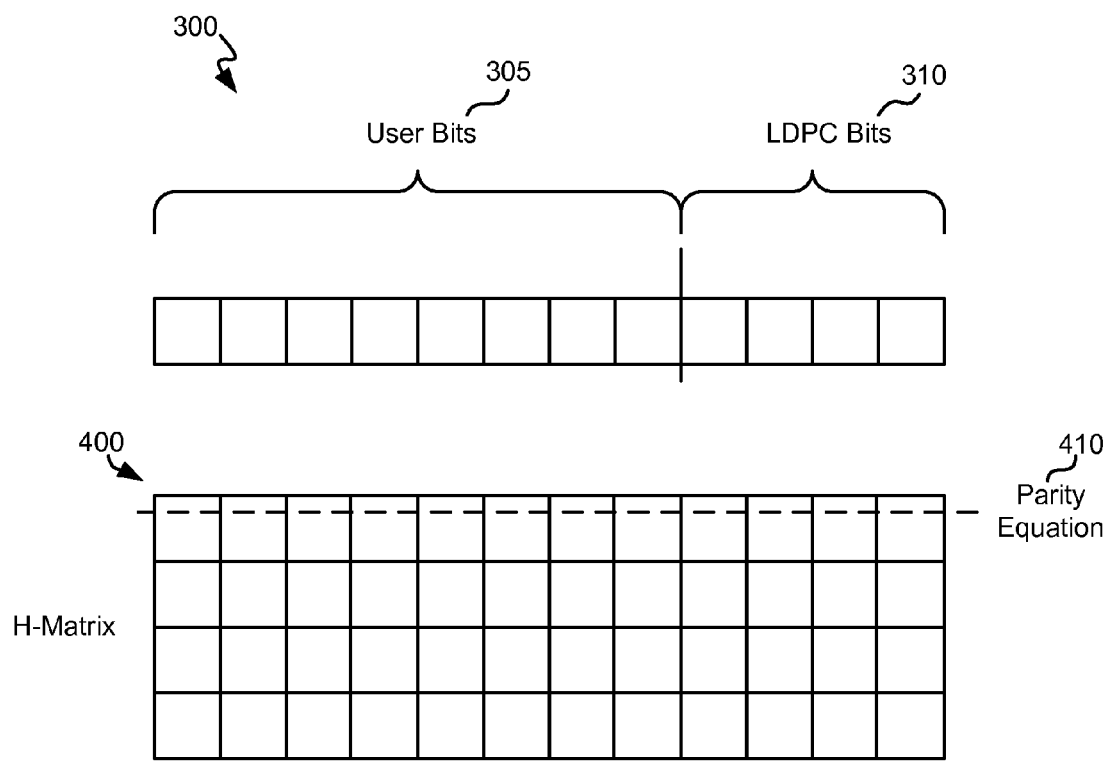
FIG. 4 shows the completed data set of FIG. 3 in relation to an H-matrix in accordance with some embodiments of the present invention.

FIG. 4 shows completed data set 300 in relation to an H-matrix 400 in accordance with some embodiments of the present invention. As shown, H-matrix 400 includes a number of parity equations involving bits along each row of the H-matrix. One particular parity equation 410 is shown. Satisfaction of the parity equation is calculated based upon a number of low density parity check bits 310 along with user bits 305. Low density parity check decoding includes determining whether parity check equation 410 failed. Where parity check equation 410 failed, the decoding failed to converge. In such a case, the parity bit within each of circulants 320 is used to determine whether the parity check for the individual circulants succeeded or failed. In a circulant where the parity failed, the circulant is identified as problematic. Said another way, the identified circulant includes a bit involved in a trapping set that resulted in a decoding failure. As each bit in a circulant participates in only one parity check equation corresponding to a block row of H-matrix 400, identification of a failed parity check equation (i.e., a parity check equation corresponding to a block row of H-matrix 400) and a problematic circulant uniquely identifies the particular bit that is in error. As such, the bit may be flipped to correct the error.

Similarly, where the parity check equations (i.e., a parity check equation corresponding to a block row of H-matrix 400) all succeed, determination that one or more of the parity checks of the individual circulants failed, it is determined that an error was mis-corrected during low density parity check decoding. The error may either be corrected directly, or the soft data associated with the particular block may be modified and the low density parity check decoding done again.

Figure 5:
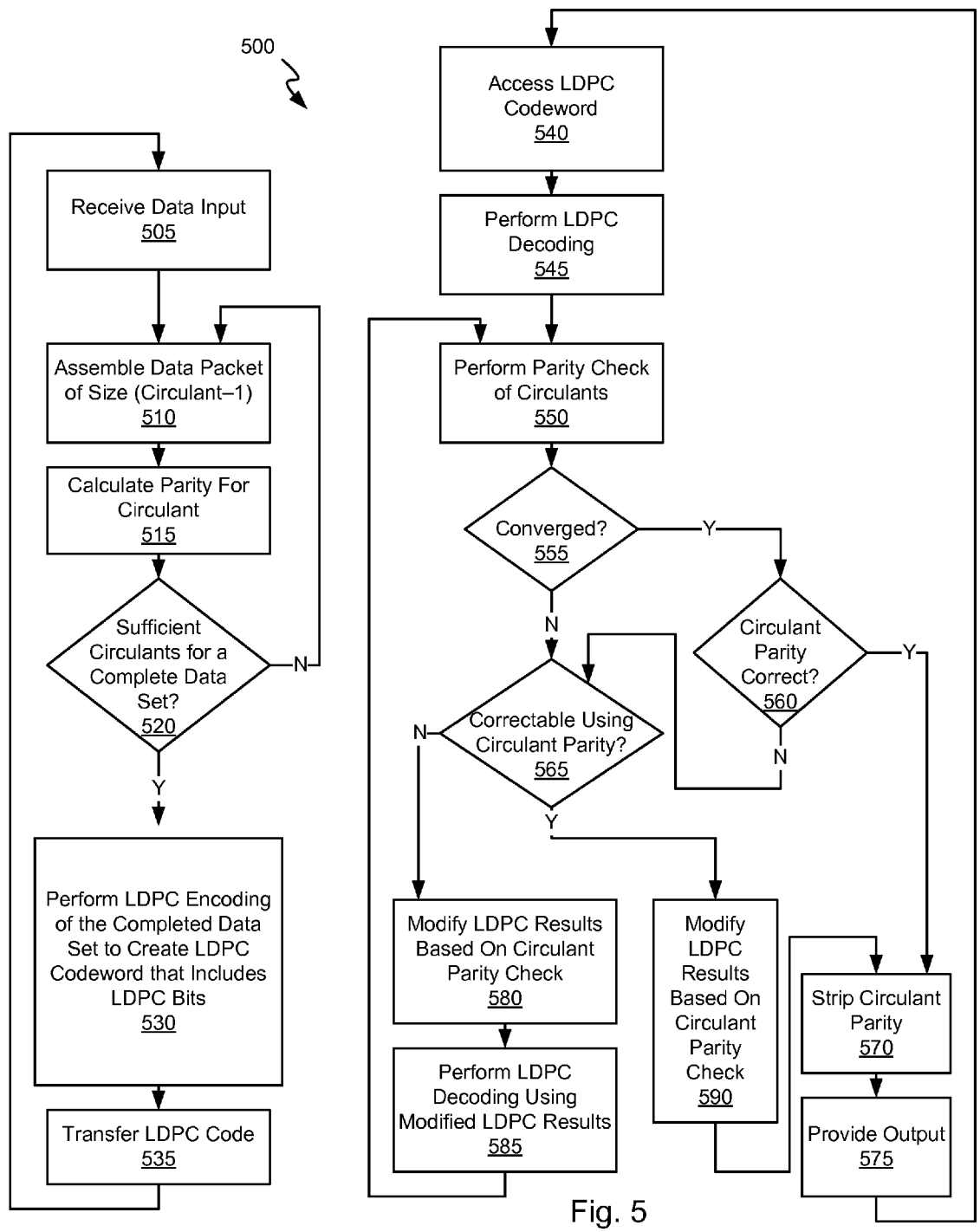
FIG. 5 is a flow diagram depicting a method in accordance with some embodiments of the present invention for data processing using parity enhanced circulants.

Turning to FIG. 5, a flow diagram 500 depicts a method in accordance with some embodiments of the present invention for data processing using parity enhanced circulants. Following flow diagram 500, a data input is received (block 505). The data input may be received from any data source, and may be received in any format. In an exemplary embodiment, the data input is received sixty-four bits at a time from a processor. Based upon the disclosure provided herein, one of ordinary skill in the art will recognize a variety of sources from which the data input may be drawn. Further, one of ordinary skill in the art will recognize a variety of formats in which the data may be received.

The data input is assembled into a number of data packets of size (Circulant Size—1) (block 510). Thus, for example where each circulant is sixty-four bits, the data input is broken into blocks of sixty-three bits. Next, a parity bit is calculated and appended to each of the circulants (block 515). The calculated parity may be either even or odd parity depending upon the particular design. As such, the parity (including the added parity bit) is defined for each circulant. It is then determined whether a sufficient number of circulants have been created to complete a completed data set (block 520). For example, where sixty-four circulants are to be created, it is determined whether the last circulant was the sixty-fourth. Where an insufficient number have been created, the processes of block 510 through block 520 are repeated.

Alternatively, where a sufficient number have been created (block 520), low density parity check encoding is performed on the completed data set to yield and low density parity check codeword (block 530). This includes adding low density parity bits to create an LDPC codeword. These low density parity check bits may be generated using any process known in the art for doing such. Creating the low density parity check codeword may be done by multiplying the completed data set by a pre-defined G-matrix as is known in the art. The created low density parity check codeword is then transferred (block 535). Such a transfer is performed in different ways depending upon the system in which the method is being performed. For example, in a hard disk drive system, the transfer includes writing the low density parity check codeword to a magnetic storage medium. As another example, in a wireless transmission system, the transfer includes transmitting the low density parity check codeword via RF signals. Based upon the disclosure provided herein, one of ordinary skill in the art will recognize a variety of transfers of the low density parity check codeword that may be done in accordance with different embodiments of the present invention.

The low density check codeword is accessed (block 540). Access of the low density parity check codeword mirrors the aforementioned transfer. For example, where the transfer is via a storage medium, access is done by retrieving data from the storage medium. Low density parity check decoding is performed (block 545). This low density parity check decoding may be done using algorithms known in the art. Next, parity checks are performed on each of the circulants (block 550). This is done by determining whether the bits in the circulant (including the added parity bit) yields the appropriate parity. Where the parity check fails, the particular circulant is identified as problematic.

It is then determined whether the low density parity check decoding converged (i.e., resulted in satisfaction of all of the low density parity check equations) (block 555). Where the decoding failed to converge (block 555), it is determined whether any remaining errors can be corrected using the identified problematic circulants (block 565). In particular, as each bit in a circulant participates in only one of the low density parity check equations, a combination of a limited number of problematic blocks and a limited number of failed low density parity check equations allows for unique identification of incorrect bits. Where the errors are correctable using the circulant parity (block 565), the low density parity check results are modified by flipping the uniquely identified error bits (block 590). The circulant parity may then be stripped (block 570), and an output of the original input data provided (block 575).

Alternatively, where the errors are not correctable using the circulant parity (block 565), the low density parity check results are modified by changing the soft data associated with problematic circulants to indicate a likelihood of an error at that location (block 580). The low density parity check decoding is performed again using the modified soft data (block 585). Then, the processes of blocks 550 through 590 are repeated based upon the new results from the low density parity check decoding.

As another alternative, where the decoding converged (block 555), it is determined whether the parity associated with each of the circulants is correct (block 560). Where the parity for each of the circulants is correct (block 560), the convergence is verified. In this case, the circulant parity may then be stripped (block 570), and an output of the original input data provided (block 575). Alternatively, where one or more circulant parities fail (block 560), the processes of blocks 566 through 590 are repeated.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method for data processing, the method comprising:
    receiving a codeword, wherein the codeword includes at least a first circulant having a plurality of data bits and a first circulant parity bit, a second circulant having a plurality of data bits and a second circulant parity bit, and one or more codeword parity bits;
    decoding the codeword using the one or more codeword parity bits to access the first circulant and the second circulant, wherein decoding the codeword results in a satisfaction of one or more codeword parity check equations relying on the codeword parity bits;
    performing a first circulant parity check on the first circulant, wherein the first circulant parity check fails;
    performing a second circulant parity check on the second circulant; and
    based at least in part on the failure of the first circulant parity check, modifying soft data derived from the decoding to indicate that the first circulant is likely incorrect.

2. The method of claim 1, wherein the decoding is low density parity check decoding.

3. The method of claim 1, wherein the method further comprises:
    receiving a data input;
    assembling data packets of a circulant size less parity bits;
    calculating parity for each of the data packets;
    augmenting each of the data packets with the calculated parity to create circulants that together form a completed data set; and
    encoding the completed data set to yield the codeword.

4. The method of claim 3, wherein the encoding is low density parity check encoding.

5. The method of claim 1, wherein the codeword is derived from a magnetic storage medium.

6. The method of claim 1, wherein the codeword is derived from a wireless transfer medium.

7. The method of claim 1, wherein the method further comprises:
    decoding the codeword using the one or more codeword parity bits and the modified soft data to access the first circulant and the second circulant.

8. The method of claim 7, wherein the method further comprises:
    performing another first circulant parity check on the first circulant; and
    performing another second circulant parity check on the second circulant.

9. The method of claim 1, wherein decoding the codeword results in a satisfaction of all codeword parity check equations relying on the codeword parity bits, wherein the first circulant parity check succeeds, wherein the second circulant parity check succeeds, and wherein the method further comprises:
    stripping the first circulant parity from the first circulant to yield a first user data set;
    stripping the second circulant parity from the second circulant to yield a second user data set; and
    providing at least the first user data set and the second user data set as a data output.

10. The method of claim 1, wherein decoding the codeword results in the failure of one or more parity check equations, wherein the first circulant parity check fails, and wherein the method further comprises:
    modifying soft data derived from the decoding to indicate that the first circulant is likely incorrect; and
    decoding the codeword using the one or more codeword parity bits and the modified soft data.

11. The method of claim 1, wherein decoding the codeword results in the failure of one or more parity check equations, wherein the first circulant parity check fails, wherein the second circulant parity check succeeds, and wherein the method further comprises:
    identifying a unique bit within the first circulant that is used in one of the one or more failed parity check equations; and
    flipping the unique bit.

12. The method of claim 11, wherein the method further comprises:
    stripping the first circulant parity from the first circulant to yield a first user data set;
    stripping the second circulant parity from the second circulant to yield a second user data set; and
    providing at least the first user data set and the second user data set as a data output.

13. A data decoder circuit, the circuit comprising:
    a low density parity check decoder, wherein the low density parity check decoder is operable to:
        receive a codeword including at least a first circulant, a second circulant, and one or more codeword parity bits, wherein the first circulant includes a plurality of data bits and a first circulant parity bit, and wherein the second circulant includes a plurality of data bits and a second circulant parity bit; and decode the codeword using the codeword parity bits to yield the first circulant and the second circulant; and a circulant parity check circuit operable to:
  determine whether the parity of the first circulant is correct, wherein the first circulant parity check fails;
  determine whether the parity of the second circulant is correct; and
  based at least in part on the failure of the first circulant parity check, modifying soft data derived from the decoding to indicate that the first circulant is likely incorrect.

14. The circuit of claim 13, wherein the circuit is operable to provide a data output when at least the low density parity check decoder converges and both the parity of the first circulant and the parity of the second circulant are correct.

15. A data processing system, the data processing system comprising:
  a data decoder circuit operable to:
    receive a codeword including: a first subset having a first data set and at least a first parity bit, a second subset having a second data set and at least a second parity bit, and one or more codeword parity bits;
    apply a data decoding algorithm to the codeword using the codeword parity bits to yield a decoded output, wherein the decoded output includes the first subset and the second subset; and
  a subset parity check circuit operable to:
    perform a first parity check on the first subset using the first parity bit to yield a first parity result, wherein the first parity result indicates a failure of the first parity check; and
    perform a second parity check on the second subset using the second parity bit to yield a second parity result; and
    based at least in part on the first parity result, modifying soft data of the decoded output corresponding to the first subset to indicate that that the first subset is likely incorrect.

16. The data processing system of claim 15, wherein the data decoder is operable to indicate a problem condition when the application of the data decoding algorithm converged and failure of first parity check.

17. The data processing system of claim 15, wherein the data processing system is implemented as part of an integrated circuit.

18. The data processing system of claim 15, wherein the data processing system is implemented as part of a data transfer system.

19. The data processing system of claim 18, wherein the data transfer system is a wireless transfer medium.

20. The data processing system of claim 18, wherein the data transfer system is a storage device.

21. The data processing system of claim 20, wherein the data processing system is incorporated in a read channel circuit, and wherein the storage device further comprises:
  a storage medium; and
  a read/write head assembly disposed in relation to the storage medium and operable to access a representation of the codeword from the storage medium.

22. The data processing system of claim 21, wherein the read/write head assembly is further operable to write the representation of the codeword to the storage medium, and wherein the read channel circuit further comprises:
  a parity augmentation circuit, wherein the parity augmentation circuit is operable to:
    receive an input data signal;
    break the input data signal into a first data set and a second data set;
    calculate the first parity bit based on the first data set;
    augment the first data set with the first parity bit to yield a first subset;
    calculate the second parity bit based on the second data set;
    augment the second data set with the second parity bit to yield a second subset; and
  an encoding circuit operable to perform low density parity check encoding on a combination of the first subset and the second subset to yield the codeword.

23. The data processing system of claim 15, wherein the data decoding algorithm is a low density parity check decoding algorithm.

24. The data processing system of claim 15, wherein the decoded output it a first decoded output, and wherein the data decoder circuit is further operable to re-apply the data decoding algorithm to the codeword guided by the first decoded output including the modified soft data to yield a second decoded output.

* * * * *